United States Patent [19]
Reitz

[11] 4,419,617
[45] Dec. 6, 1983

[54] THERMALLY ELECTROGENERATIVE STORAGE CELL AND GENERATOR APPARATUS

[76] Inventor: Ronald P. Reitz, P.O. Box 1543, Annapolis, Md. 21401

[21] Appl. No.: 47,354

[22] Filed: Jun. 11, 1979

Related U.S. Application Data

[63] Continuation-in-part of Ser. No. 5,724, Jan. 23, 1979, abandoned.

[51] Int. Cl.³ .............................................. H02N 1/00
[52] U.S. Cl. .................................. 322/2 R; 136/208; 310/308; 313/537
[58] Field of Search ............... 136/208, 209, 210, 211, 136/212, 226, 227; 429/106, 107, 110; 310/308, 309; 313/99; 322/2 R

[56] References Cited

U.S. PATENT DOCUMENTS

| | | |
|---|---|---|
| 3,113,047 | 12/1963 | Lasser et al. ............... 429/107 X |
| 4,125,122 | 11/1978 | Stachurski ................. 136/210 X |
| 4,126,149 | 11/1978 | Reitz ............................ 313/99 X |
| 4,179,627 | 12/1979 | Reitz ............................ 313/99 X |
| 4,327,161 | 4/1982 | Reitz .............................. 429/110 |
| 4,349,615 | 9/1982 | Reitz .............................. 429/110 |

*Primary Examiner*—Leland A. Sebastian
*Attorney, Agent, or Firm*—Schwartz, Jeffery, Schwaab, Mack, Blumenthal & Koch

[57] ABSTRACT

Apparatus are described for converting thermal energy into electrical energy wherein the electrical energy conversion is accomplished by the use of materials having thermally dependent magnetic susceptibilities. In some embodiments one of the electrodes of the apparatus may be an electrode of an electrochemical storage cell.

7 Claims, 3 Drawing Figures

THERMALLY ELECTROGENERATIVE STORAGE CELL AND GENERATOR APPARATUS

This application is a continuation-in-part of application Ser. No. 5,724 filed Jan. 23, 1979 entitled Thermally Rechargable Electrochemical Storage Cell, now abandoned.

FIELD OF THE INVENTION

The invention is in the field of thermally rechargable electrochemical storage cells.

DESCRIPTION OF PRIOR ART

Prior art thermally rechargable electrochemical storage cells utilize semiconductor material as an electrode in some cases. In this embodiment the semiconductor material is bifurcated at one end and only one leg of the bifurcated electrode is immersed in the electrolyte. The non-bifurcated end of the electrode is heated after the electrode is placed in a magnetic field. The thermal gradient established across the electrode is at least partially perpendicular to the magnetic field such that the electrons and holes which migrate across the electrode are separated by the magnetic field at the bifurcation. This results in a voltage being established across the electrode. The electrode is connected electrically to other electrode of the electrochemical storage cell and the battery is charged up by the electric energy produced by the electrode. The disadvantage of such a battery lies in the cost of the semiconductor electrode and the low efficiency of the device.

Prior art thermal conversion electrochemical cells of the aforementioned type are referred to in the prior application, U.S. Ser. No. 5,724 filed Jan. 23, 1979.

Prior art thermal conversion electrochemical cells are also referred to in U.S. Pat. No. 3,253,955. An electrochemical storage cell arrangement is referred to in which the cell consists of two half cells. The cell container is divided into two chambers by a wall which is an ion bridge. The two chambers of the container are provided with electrodes, preferably being reversible and such that the electrodes are of one of the materials of the electrolyte solution of the cell. Each chamber of the container receives an ionizable chemical compound in a suitable solvent, such as cupric sulphate in water. A temperature differential is obtained between the two chambers by application of heat to one of the two chambers. A change in solubility results in at least one chamber of the cell due to the change in temperature and additional amounts of crystalline cupric sulphate, which is in excess, go into solution or are removed from solution. Due to the different amounts of cupric sulphate in solution in the two chambers of the cell and the temperature differential or thermo-couple effect an electrical potential is obtained. The disadvantage of this type of electrochemical cell is that the electric energy produced from the heat energy is not stored by the electrochemical cell since, when the temperature difference is no longer provided, the potential is no longer obtained.

A prior art system is shown in U.S. Pat. No. 4,146,680 entitled Operational Zinc Chlorine Battery Based On A Water Store. The zinc-chlorine battery system is a system in which chlorine gas evolved from the cell structure of the battery is combined with a stored supply of water to form solid chlorine hydrate. During the time of discharge of the battery, the chlorine hydrate is decomposed to replenish the chlorine content of the electrolyte. It is understood that such a battery system could have a variety of uses, such as in being used to store electrical energy whereby an electric motor may be driven to power the locomotion of an automobile, however, this system requires many parts including a separate water store and therefore, the system requires much space for the zinc-chlorine battery system to be carried in or by said automobile.

It is therefore an object of this invention to provide for a high efficiency heat energy conversion means whereby heat energy is converted into electric energy.

It is also an object of this invention to provide a heat energy to electric energy conversion means of low cost.

It is further an object of this invention to provide an electrical energy from heat energy system of widespread application.

The apparatus according to the invention produces electrical energy from heat energy and therefore various objects, advantages and features other than those already mentioned will become apparent to those skilled in the art from the following description taken in connection with the accompanying drawings, in which.

In accordance with the present invention method and means for obtaining electric energy and the storage of said electric energy are provided. It is felt that some basic principles must first be understood in order one to better comprehend the nature of the devices in this application.

Between the plates of a charged capacitor is an electric field. The strength of this electric field is determined generally by the voltage applied to the capacitor plates, by the dielectric constant of the dielectric between the capacitor plates and by the distance between the plates of the capacitor such that for a flat plate capacitor $$C = Q/V = Q/Ed$$

where
C is the capacitance in farads
Q is the charge on the capacitor plates
V is the voltage applied to the capacitor plates
E is the electric field between the plates and
d is the distance between the capacitor plates.

If the plates of the capacitor are disconnected from the voltage source applying the voltage, it will generally hold charge if it is electrically isolated. The charge on the capacitor plates will then remain constant in accordance with the law of conservation of charge. If a force is now applied to the capacitor plates so as to force the plates further apart from each other, then work is done and the distance between the plates of the capacitor is increased. The increase in the distance between the charged plates is accompanied with an increase in the voltage potential between the two capacitor plates. Since $$V = Ed = (\sigma/k\epsilon_o)d$$

where
o is the surface charged density of the plates, k is the dielectric constant of the dielectric between the plates, and $\epsilon_o$ is the vacuum permittivity constant The increase in the electric energy of the capacitor plates is therefore calculable if the variables are known.

Another fact important to the scope of this invention is mentioned in the prior application wherein it is known that the magnetic permeability of some materials can change as the temperature of those materials changes. Some such materials are soft iron as mentioned in U.S. Pat. No. 1,556,183; ferrofluidic solutions such as cited in U.S. Pat. No. 4,064,409; and ferrimagnetic materials of NiO, of ZnO, and of $Fe_2O_3$ as mentioned in the prior application, U.S. Ser. No. 5,724 filed Jan. 23, 1979, now abandoned.

DETAILED DESCRIPTION OF THE PREFERRED EMBODIMENTS

Figure 1:
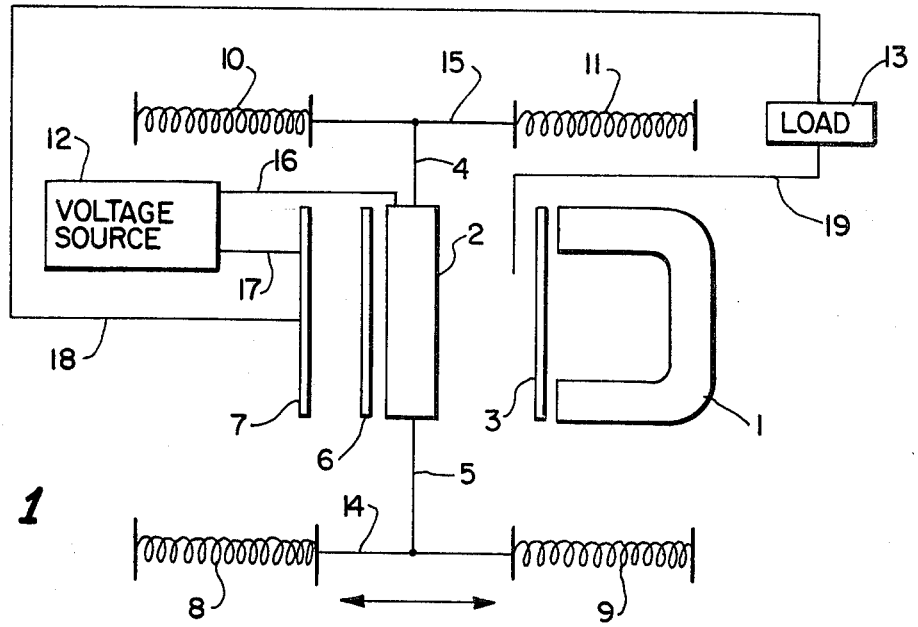
FIG. 1 is a diagrammatic view of a form or embodiment.

The invention will be understood more readily by referring to FIG. 1 which is a diagrammatic view of the first form of the invention, which uses the attraction of magnetic fields and the heat energy effects on the magnetic permeability of ferromagnetic materials. A permanent magnet 1 is positioned in spaced relationship to magnetic electrode 2. Magnetic electrode 2 need not be a permanent magnet but only a material of high magnetic character. Placed between magnetic electrode 2 and permanent magnet 1 is ferromagnetic material 3 whose magnetic permeability varies with its temperature. Ferromagneic material 3 is preferably such that it has a low Curie temperature. To effectively reduce the Curie temperature of the material, the ferromagnetic material may be encapsulated in an evacuated tube (not shown) such that the vacuum therein allows for the ferromagnetic material to sublimate at temperatures lower than the Curie temperature. Ferromagnetic material 3, when cool, forms a magnetic circuit with permanent magnet 1. Ferromagnetic material 3 and said magnetic electrode 2 are positioned in spaced relationship to each other such as to allow the magnetic electrode 2 to move with respect to ferromagnetic material 3. Magnetic electrode 2 is shown with arms 4 and 5 connected thereto. Spaced proximate to magnetic electrode 2 and further away from ferromagnetic material 3 is electrode 7. A dielectric means 6 necessarily exists between electrode 7 and magnetic electrode 2.

Magnetic electrode 2 is spring biased in the position shown by means of springs 8, 9, 10 and 11. Biasing links 14 and 15 connect arms 4 and 5 to the spring members as shown.

As shown in FIG. 1, the electrode 7 and magnetic electrode 2 are positioned such that they are both touching, as shown, electrically conductive wire leads 17 and 16 respectively, which are connected to the output of a voltage source 12, such that electrode 7 and magnetic electrode 2 act as a charged capacitor. Also connected to electrode 7 by electrically conductive wire lead 18 is load 13. The other electrically opposite lead of load 13, electrically conductive wire lead 19, is positioned such that it is not electrically touching magnetic electrode 2 but is positioned such that, should magnetic electrode 2 move toward permanent magnet 1, said magnetic electrode 2 at some location in its motion toward said permanent magnet 1 electrically touches electrically conductive wire lead 19. For this to be possible, the wire lead 19 must thus be placed as shown, in such a manner that magnetic electrode 2 can touch said wire lead 19 electrically and thus said wire lead 19 must be positioned so that it is within the field of motion of said magnetic electrode 2.

In operation, initially the magnetic electrode 2 and electrode 7 are touching the opposite leads 16 and 17 respectively, of voltage source 12 as shown. Thus magnetic electrode 2 and electrode 7 act as charged electrodes of a capacitor. The ferromagnetic material 3 is heated by an appropriate means (not shown) such as running hot water from a car radiator through a metal pipe (not shown) which is adjacent to either ferromagnetic material 3 or its evacuated tube container (not shown). Ferromagnetic material 3 increases in its temperature by heating from said appropriate heating means (not shown). This results in an increase of the effective magnetic permeability of said ferromagnetic material 3. The magnetic field produced by permanent magnet 1 therefore permeates through the ferromagnetic material 3 and attracts magnetic electrode 2 to such an extent that magnetic electrode 2 moves toward permanent magnet 1. As magnetic electrode 2 moves toward permanent magnet 1, it is disconnected electrically itself from wire lead 16. As said magnetic electrode 2 continues to move toward permanent magnet 1, the distance between electrode 7 and said magnetic electrode 2 increases, thereby increasing the voltage potential between said electrode 7 and said magnetic electrode 2.

Magnetic electrode 2 continues to move toward permanent magnet 1 and electrically touches electrically conductive wire lead 19. Electrode 7 and magnetic electrode 2 discharge into load 13.

After this occurs ferromagnetic material 3 is cooled by first shutting off the flow of hot water through the metal pipe (not shown) which is adjacent to either the ferromagnetic material 3 or adjacent to the evacuated tube container (not shown) which houses said ferromagnetic material 3. Said evacuated tube container (not shown) may be comprised of glass or other suitable materials. Cold water is now permitted to flow through another pipe (not shown) which is adjacent to the ferromagnetic material 3. Ferromagnetic material 3 cools and thereby decreases in its magnetic permeability, and thus forms a magnetic circuit with permanent magnet 1. As this occurs, the magnetic attraction of magnetic electrode 2 toward permanent magnet 1 decreases and springs 8, 9, 10 and 11 return magnetic electrode 2 to its initial position by biasing links 14 and 15. Ferromagnetic material 3 is then heated again and the operation is repeated.

Permanent magnet 1 may be an iron core magnet, ferromagnetic material 3 may be $Fe_2O_3$ and magnetic electrode 2 may be nickel. Dielectric means 6 may be glass, electrode 7 may be copper and load 13 may be a battery which is intended to be charged. Voltage source 12 may be a thermocouple. It is apparent to those skilled in the art that the aforementioned elements of the device may be replaced by other suitable elements. It is further appreciated that the permanent magnet can be replaced by an electromagnet with no substantial decrease in the performance of the device. It is also appreciated that the dielectric means 6 may consist of magnetic material such as iron covered by glass, said dielectric means 6 being attached to the magnetic electrode 2 by a suitable means such as Elmer's glue. In this case, magnetic electrode 2 need not necessarily be magnetic since the dielectric means 6 would be attracted by the magnetic field of permanent magnet 1 when ferromagnetic material 3 is heated. Thus the dielectric means 6 would move with the electrode and the device may still function with little or no loss in efficiency.

Figure 2:
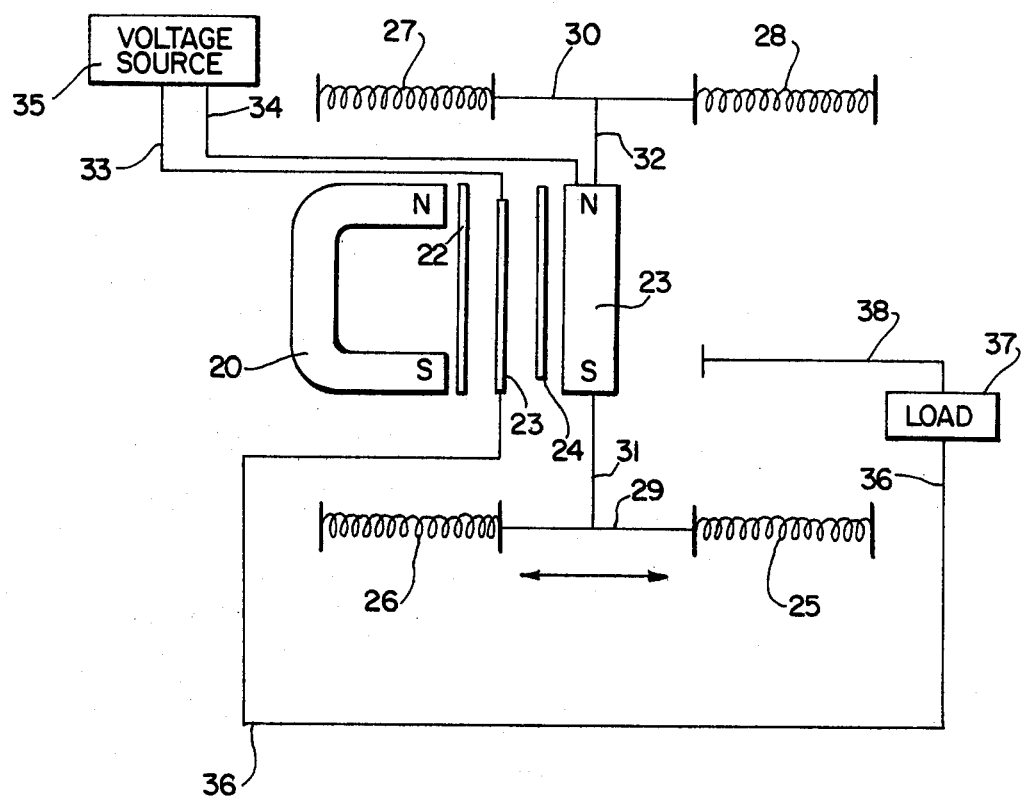
FIG. 2 is another diagrammatic view of an embodiment.
Figure 4:
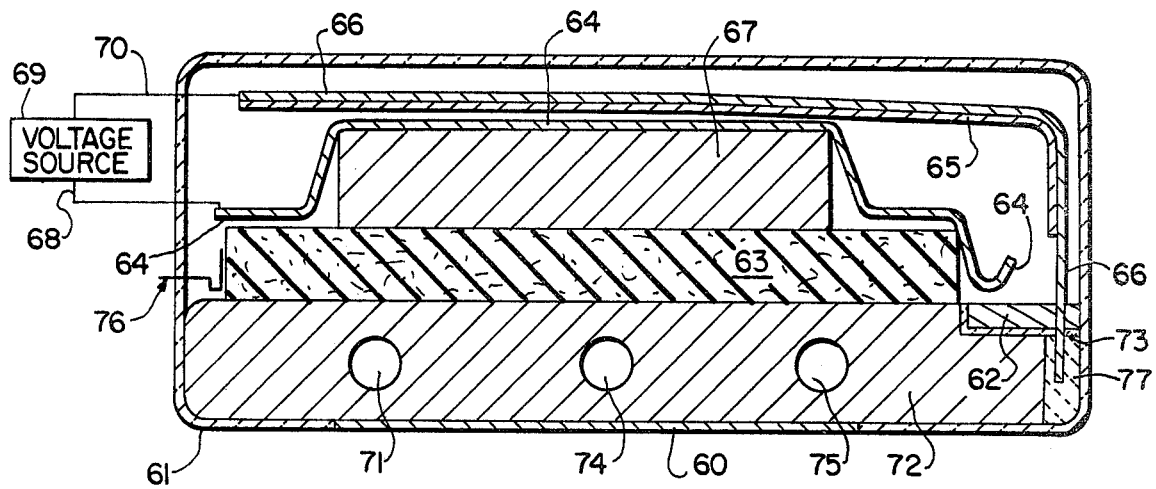
Figure 5:
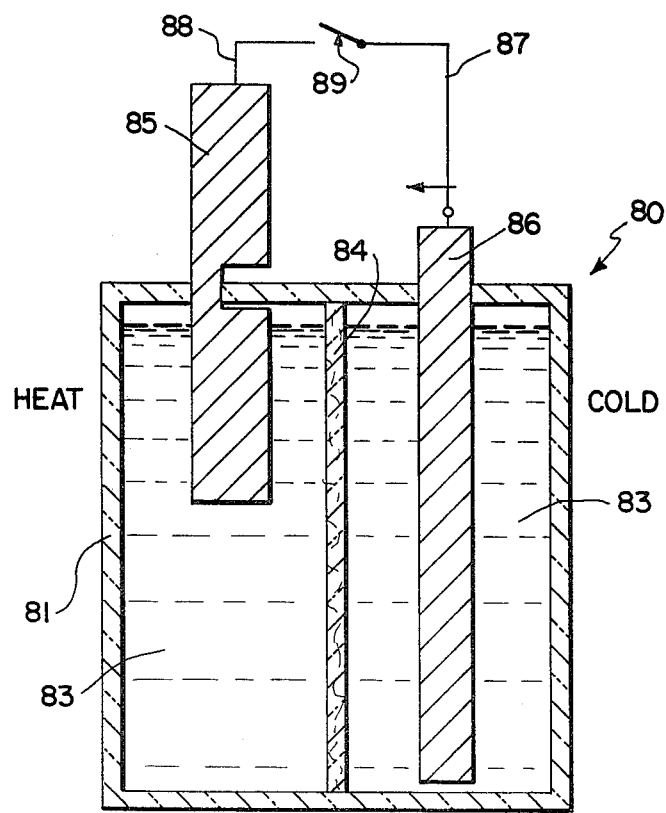
Figure 6:
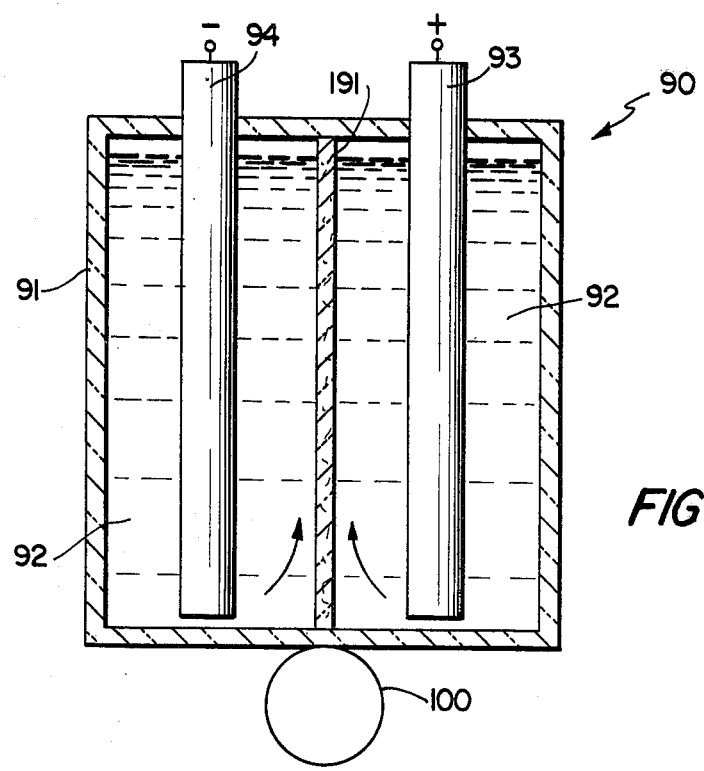
Figure 7:
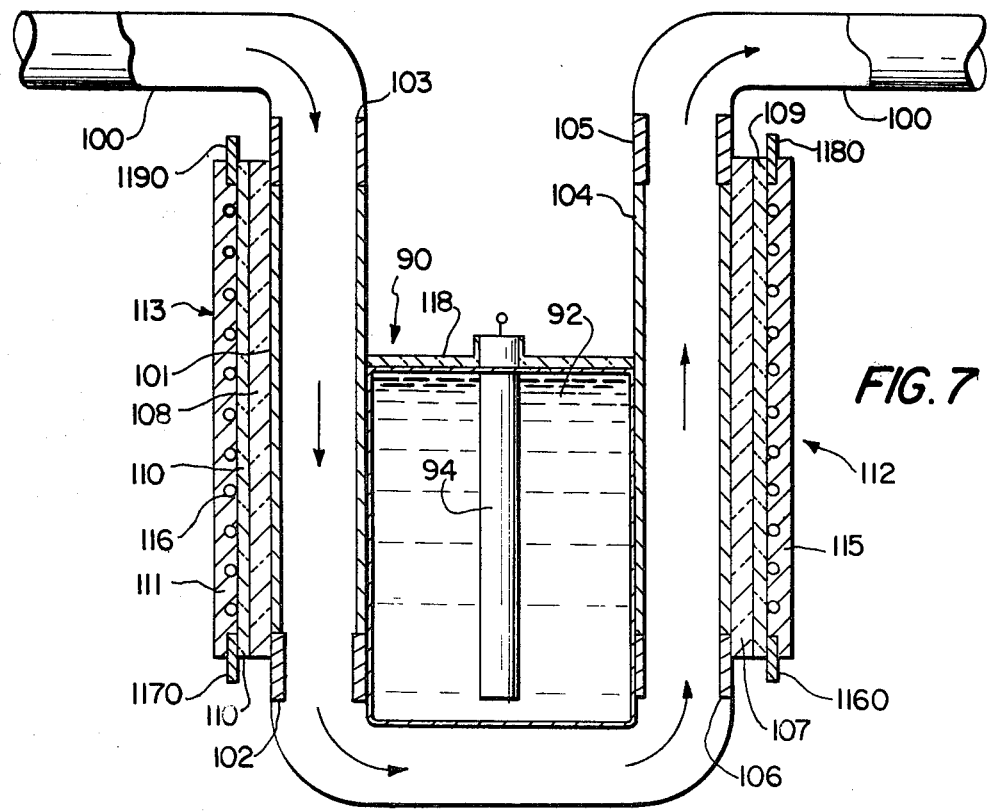

Referring to FIG. 2 now, which is a diagrammatic view of another embodiment of the invention, a permanent magnet 20 is positioned in spaced relationship to fixed electrode 21 with a ferromagnetic material 22 positioned therebetween. The magnetic permeability of said ferromagnetic material increases with increasing temperature. Electrode 21 is composed of electrically conductive material of substantial magnetic permeability, such as copper. Spaced proximate to electrode 21 and further away from ferromagnetic material 22 is permanent magnet electrode 23. Magnet electrode 23 is shown with arms 31 and 32 connected thereto. A dielectric means 24 necessarily exists between electrode 21 and permanent magnet electrode 23 and may be comprised of glass or other suitable means. Permanent magnet electrode 23 is spring biased in position as shown by means of springs 25, 26, 27 and 28. Biasing links 29 and 30 connect arms 31 and 32 to the spring members.

As shown in FIG. 2, electrode 21 and permanent magnet electrode 23 are positioned as shown such that they are electrically touching electrically conductive wire leads 33 and 34, respectively, which are connected to the output of a voltage source 35 such that electrode 21 and permanent magnet electrode 23 act as a charged capacitor. Also connected to electrode 21 by electrically conductive wire 36 is load 37. The other electrically conductive and opposite in electrical polarity wire lead 38 is positioned such that it is not electrically touching permanent magnet electrode 23 but is positioned such that, should permanent magnet electrode 23 move further away from permanent magnet 20, said permanent magnet electrode 23 at some location in its motion away from said permanent magnet 20 electrically touches electrically conductive wire lead 38.

In operation, initially the ferromagnetic material, such as a bar of Fe$_2$O$_3$, is heated by an appropriate means (not shown) such as running hot water from a car radiator through a metal pipe (not shown) which is adjacent to the ferromagnetic material 22. Electrode 21 and permanent magnet electrode 23 act as a charged capacitor since they are connected to the output of voltage source 35 by electrically conductive wire leads 33 annd 34, respectively. As ferromagnetic material 22 is heated, its magnetic permeability increases and thus the magnetic field of permanent magnet 20 permeates through said ferromagnetic material 22. As this occurs, the magnetic field of permanent magnet 20 repels permanent magnet electrode 23 such that said permanent magnet electrode 23 moves away from permanent magnet 20 which is fixed in position with respect to ferromagnetic material 22 and electrode 21. As permanent magnet electrode 23 moves, it loses electric contact with electrically conductive lead 34. As the distance between the permanent magnet electrode 23 and electrode 21 increases, the voltage potential between said permanent magnet electrode 23 and electrode 21 increases. Permanent magnet electrode 23 move further away from electrode 21 and electrically touches electrically conductive wire lead 38. As this occurs, electrode 21 and permanent magnet electrode 23 discharge their electrical energy into load 37.

After this occurs, ferromagnetic material is cooled by first shutting off the flow of hot water the metal pipe (not shown) adjacent to said ferromagnetic material 22 and then by permitting cold water to flow through another pipe (not shown) which is adjacent to said ferromagnetic material 22. Ferromagnetic material 22 cools and thereby its magnetic permeability decreases so that said ferromagnetic material 22 forms a magnetic circuit with permanent magnet 20. As this magnetic circuit forms, the repulsion between permanent magnet electrode 23 and permanent magnet 20 decreases. Permanent magnet electrode 23 is returned to its initial position by springs 25, 26, 27 and 28 and by biasing links 29 and 30. Ferromagnetic material 22 is then heated again and the operation is repeated.

Permanent magnet 20 may be an iron core magnet, ferromagnetic material 22 may be Fe$_2$O$_3$ and permanent magnet electrode 23 may be a permanent bar magnet of nickel. Electrode 21 may be composed of copper and load 37 may be a battery which is to be charged. Voltage source 35 may be thermocouple. It is apparent to those skilled in the art that the aforementioned elements of the device may be replaced by other suitable elements. It is appreciated that the permanent magnet 20 can be replaced with an electromagnetic such that no substantial decreases in the performance of the device occur.

It is also appreciated that the dielectric means 24 may consist of a permanent magnet of iron covered by glass, said dielectric means being attached to permanent magnet electrode 23 by a suitable means such as glue. In the event that the poles of the iron magnet inside the dielectric repel the poles of the permanent magnet 20 when the ferromagnetic material 22 is heated above its Curie temperature, then the permanent magnet electrode 23 need not be magnetic but may be replaced by non-magnetic electrode material such as silver. Thus dielectric means 24 would move with the electrode 23 and the device may still function with little or no loss in efficiency.

Figure 3:
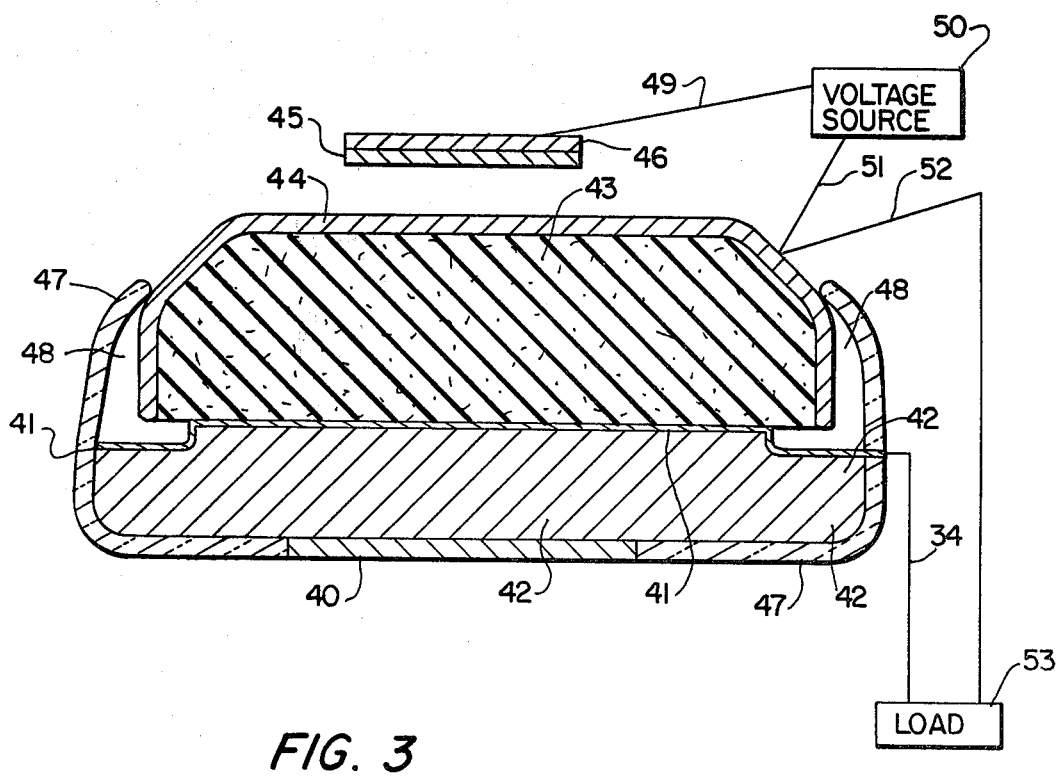
FIG. 3 is a cross-sectional view of the device with the electronic circuit in block diagrammatic view.

FIG. 3 is a cross-sectional view of another electrical generator which is of the type which is diagrammatically depicted in FIG. 1. Permanent magnet 40 is spaced proximate electrode 41 with ferromagnetic material 42 positioned therebetween. Spaced proximate to electrode 41 and further away from ferromagnetic material 42 is electrode 44 with sponge rubber material 43 positioned between said electrode 44 and electrode 41. Spaced, as shown, from electrode 44 and further away from sponge material 43 is electrode 46 with dielectric slab 45 disposed, as shown, between said electrode 46 and electrode 44. Dielectric 45 is glued to underside of electrode 46 by an appropriate means such as epoxy glue. Electrode 46 is suspended over electrode 44 by a suitable means (not shown) such as a stand placed next to or in the near proximate space to the electrode. Glass ring 47 is positioned as shown so that it is adjacent to both permanent magnet 40 and ferromagnetic material 42. Glass ring 47 is fitted in such a fashion as shown so that it serves as a housing means for some of the parts of the generator. Glass ring 47 is formed such that electrode 41 extends through glass ring 47 at one location as shown. Glass ring 47 is also formed as shown so that it narrows at the top and serves as a means of limiting the distance between electrodes 44 and 41. Air gap 48 is, as shown, in the housed area and is the result of the design of the device. Air gap 48 is, in part, between electrode 41 and electrode 44. As shown in FIG. 3 electrically conductive wire leads 49 and 51, which are connected to the output of a voltage source 50 such that they are of opposite electrical polarity to each other, are touching electrode 46 and electrode 44, respectively. Electrodes 46 and 44, being electrically connected to voltage source 50, act as a charged capacitor. Connected, as shown, to electrode 44 by electrically conductive wire lead 52 is load 53. The other electrically opposite lead of load 53, electrically conductive wire lead 54, is electrically connected, as shown, to electrode 41.

Electrode 41 is composed of electrically conductive material of high magnetic permeability while electrode 44 is composed of electrically conductive material which is magnetic.

Initially, the device and its elements are as shown in FIG. 3. Electrodes 46 and 44 act as a charged capacitor since they are electrically touching the electrically conductive wire leads 49 and which are connected to the output of voltage source 50, as shown. Ferromagnetic material 42 is heated by an appropriate means (not shown) such as flowing hot water from a car radiator through a metal pipe (not shown) which is adjacent to glass ring 47 and permanent magnet 40. As ferromagnetic material 42 increases in temperature, its magnetic permeability increases so that the magnetic field of permanent magnet 40 permeates through ferromagnetic material 42, electrode 41 and sponge rubber material 43. Electrode 44 is attracted toward permanent magnet 40 and compresses sponge rubber material 43. The motion of electrode 44 toward permanent magnet 40 electrically disconnects electrode 44 from electrically conductive wire lead 51 so that electrode 44 is no longer touching electrically conductive wire lead 51. Electrode 44 continues to move toward permanent magnet 40 until it touches electrode 41 at which time electrodes 46 and 44 discharge their electrical energy into load 53.

After this occurs, the flow of hot water through the metal pipe (not shown) which is adjacent to glass ring 47 and permanent magnet 40 is shut off. Cold water is now permitted to flow through said metal pipe (not shown) which is adjacent to glass ring 47 and permanent magnet 40. Ferromagnetic material 42 cools and decreases in its magnetic permeability such that it forms a magnetic circuit with permanent magnet 40. The magnetic circuit thus formed causes the magnetic attraction between permanent magnet 40 and electrode 44 to decrease. As this occurs, electrode 44 is returned to its initial position by sponge rubber material 43. Ferromagnetic material 42 is then heated again and the operation is repeated.

Permanent magnet 40 may be an iron core magnet, ferromagnetic material 42 may be composed of $Fe_2O_3$ and electrode 44 may be composed of nickel. Dielectric 45 may be composed of glass, electrode 41 may be composed of copper and load 53 may be a battery which is intended to be charged. Voltage source 50 may be a thermocouple. It is apparent to those skilled in the art that the aforementioned parts of the device may be replaced by other suitable elements. It is further appreciated that the permanent magnet 40 can be replaced by an electromagnet with no substantial decrease in the performance of the device. It is yet further appreciated that electrode 44 may actually be composed of an electrically conductive material such as silver which covers a magnetic material such as iron. Electrode 46, electrically conductive wire leads 49, 51, 52 and 54 may be composed of copper.

It is appreciated that many other configurations of ferromagnetic static electric generators can be made. For instance, it is possible to replace the use of magnetic field means attracting a charged electrode toward itself and thereby increase the capacitance of the charged electrodes, with the use of magnetic field means repelling a charged electrode from itself and thereby increasing the capacitance of the charged electrodes.

It is appreciated that thermally rechargable electrochemical storage cells may have many uses. One such use may be that the thermally rechargable electrochemical storage cells can be used to change the waste heat from an automobile engine into electric energy which can be used to drive the aforementioned automobile electrically. Thermally rechargable electrochemical storage cells may possibly be sold in stores along with detachable electric motors that may be attached to the wheels of an automobile to serve as a means of locomotion. It is further appreciated that thermally rechargable electrochemical storage cells may be used in conjunction with solar thermal collectors to convert the heat energy collected from the sun into electric energy for home use, industrial use or other desirable uses. It is yet further appreciated that thermally rechargable electrochemical storage cells may be used to convert geothermal energy into electrical energy for a variety of uses. It is still further appreciated that electrical generators of the type applied for and mentioned in this application may be used in like manner to convert solar, geothermal or other heat energies into electrical energy for a variety of uses.

It is understood that the materials mentioned in this patent application are not the only materials which may be used in the manner aforementioned to convert heat energy into useful electric energy and it is understood that this application protects the inventor in the very scope and spirit of the invention.

I claim as my invention:

1. Apparatus for generating electric energy from heat energy comprising:
   (a) a first electrode means,
   (b) a second electrode means spaced proximate said first electrode means such that a first dielectric region is established therebetween,
   (c) means for initially charging said first and second electrode means,
   (d) means for electrically disconnecting said first electrode means from said means for initially charging said first and second electrode means,
   (e) means for decreasing the capacitance between said first and second electrode means after said first electrode means has been electrically disconnected from said charging means,
   (f) means for electrically connecting said first and second electrode means in circuit with a load to be driven which is desired to be driven,
   (g) said means for decreasing the capacitance between said first and second electrode means further comprising means for magnetically forcing said first electrode to move with respect to said second electrode such that the distance between said first and second electrode means is increased,
   (h) said magnetic forcing means further comprising a magnetic field producing means, a ferromagnetic material positioned substantially within the magnetic field produced by said magnetic field producing means and a means whereby said ferromagnetic material may be caused to increase and decrease in temperature such that the magnetic permeability of said ferromagnetic material is made to vary in strength thereby causing the magnetic field in the space proximate said ferromagnetic material to be made to vary in strength.

2. Apparatus for generating electric energy from heat energy comprising:
(a) a first electrode means,
(b) a second electrode means spaced proximate said first electrode means such that a first dielectric region is established therebetween,
(c) means for initially charging said first and second electrode means,
(d) means for electrically disconnecting said second electrode means from said means for initially charging said first and second electrode means,
(e) means for decreasing the capacitance between said first and second electrode means after said second electrode means has been electrically disconnected from said charging means,
(f) means for electrically connecting said first and second electrode means in circuit with a load to be driven,
(g) said means for decreasing the capacitance between said first and second electrode means further comprising means for magnetically forcing said first electrode to move with respect to said second electrode such that the distance between said first and second electrode means is increased,
(h) said magnetic forcing means further comprising a magnetic field producing means, a ferromagnetic material positioned substantially within the magnetic field produced by said magnetic field producing means and a means whereby said ferromagnetic material may be caused to increase and decrease in temperature such that the magnetic permeability of said ferromagnetic material is made to vary in strength thereby causing the magnetic field in the space proximate said ferromagnetic material to be made to vary in strength.

3. Apparatus defined in claim 1 wherein said magnetic field producing means is a permanent magnet which is spaced proximate said first electrode means.

4. Apparatus as defined in claim 1 wherein said means for charging said first and second electrode means comprises a thermocouple voltage source.

5. Apparatus as defined in claim 1 further comprising a means whereby said first and second electrode means may be returned to their initial position with respect to each other after said first and second electrode means have discharged their electrical energy into said load to be driven.

6. Apparatus as defined in claim 1 wherein said first electrode means also comprises a permanent magnet.

7. Apparatus as defined in claim 1 wherein said second electrode means also comprises a permanent magnet.

* * * * *